(12) United States Patent
Scholz

(10) Patent No.: US 9,978,510 B2
(45) Date of Patent: May 22, 2018

(54) PLANAR TRANSMITTER

(71) Applicant: Phoenix Contact GmbH & Co. KG, Blomberg (DE)

(72) Inventor: Peter-Dominik Scholz, Brakel (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 342 days.

(21) Appl. No.: 14/418,308

(22) PCT Filed: Aug. 9, 2013

(86) PCT No.: PCT/EP2013/002399
§ 371 (c)(1),
(2) Date: Jan. 29, 2015

(87) PCT Pub. No.: WO2014/029472
PCT Pub. Date: Feb. 27, 2014

(65) Prior Publication Data
US 2015/0194258 A1 Jul. 9, 2015

(30) Foreign Application Priority Data
Aug. 22, 2012 (DE) .......... 10 2012 016 569

(51) Int. Cl.
*H01F 27/29* (2006.01)
*H01F 38/14* (2006.01)
(Continued)

(52) U.S. Cl.
CPC ......... *H01F 38/14* (2013.01); *H01F 17/0013* (2013.01); *H01F 17/04* (2013.01);
(Continued)

(58) Field of Classification Search
USPC ........................................ 307/104
See application file for complete search history.

(56) References Cited

U.S. PATENT DOCUMENTS 3,685,144 A 8/1972 Trimble
6,466,454 B1 10/2002 Jitaru
(Continued)

FOREIGN PATENT DOCUMENTS

DE 3722124 A1 2/1988
DE 102007019111 A1 10/2008
(Continued)

OTHER PUBLICATIONS

"German Office Action", issued in parent patent application No. 10 2012 016 569.2 dated Mar. 28, 2013.
(Continued)

*Primary Examiner* — Hal Kaplan
*Assistant Examiner* — Xuan Ly
(74) *Attorney, Agent, or Firm* — Kaplan Breyer Schwarz, LLP

(57) ABSTRACT

A planar transmitter having a vertical extent and a horizontal extent, having a layer structure with a plurality of electrical circuits, wherein a first electrical circuit and a second electrical circuit are electrically conductively disconnected from one another. The transmitter also has at least one magnetic core which at least partially surrounds the layer structure and acts at least on the first electrical circuit and on the second electrical circuit, wherein the first electrical circuit and the second electrical circuit lie substantially in one plane and form one layer of the layer structure. Provision is further made for at least the first electrical circuit or the second electrical circuit to be subdivided into a plurality of electrical circuits which are electrically conductively disconnected from one another.

11 Claims, 4 Drawing Sheets

(51) Int. Cl.
*H01F 17/00* (2006.01)
*H01F 17/04* (2006.01)
*H01F 27/28* (2006.01)
*H05K 1/16* (2006.01)
*H05K 1/14* (2006.01)
*H05K 3/46* (2006.01)
*H01F 19/08* (2006.01)

(52) U.S. Cl.
CPC ......... *H01F 27/2804* (2013.01); *H01F 27/29* (2013.01); *H05K 1/165* (2013.01); *H01F 2019/085* (2013.01); *H01F 2027/2819* (2013.01); *H05K 1/141* (2013.01); *H05K 3/46* (2013.01); *H05K 2201/086* (2013.01)

(56) References Cited

U.S. PATENT DOCUMENTS

| | | | |
|---|---|---|---|
| 2008/0061631 A1 | 3/2008 | Fouquet et al. | |
| 2010/0188872 A1 | 7/2010 | Matsumoto et al. | |
| 2011/0133561 A1* | 6/2011 | Kanazawa | H01F 27/2804 307/75 |
| 2012/0098486 A1* | 4/2012 | Jung | H02J 5/005 320/108 |
| 2012/0206060 A1 | 8/2012 | Beyer et al. | |

FOREIGN PATENT DOCUMENTS

| | | | |
|---|---|---|---|
| DE | 102010001888 A1 | | 8/2010 |
| DE | 102009057788 | * | 6/2011 |
| DE | 102009057788 A1 | | 6/2011 |
| WO | 2011047819 A1 | | 4/2011 |
| WO | WO2011047819 | * | 4/2011 |

OTHER PUBLICATIONS

"Counterpart International Application No. PCT/EP2013/002399", "International Preliminary Report on Patentability", dated Mar. 5, 2015, Publisher: International Bureau of WIPO, Published in: CH.

"Related International Application No. PCT/EP2013/002399", "International Search Report and Written Opinion", dated Dec. 10, 2013, Publisher: PCT—EPO as International Searching Authority, Published in: EP.

Contact: Wolfgang Wehner, "German Examination of counterpart German Patent Application 102012018589.2", dated Jun. 30, 2017, 14 pages.

"Chinese Office Action", issued in related Chinese Patent Application No. 201380043892.7, dated Feb. 3, 2017, 10 pp.

\* cited by examiner

PLANAR TRANSMITTER

FIELD OF THE INVENTION

The invention relates to a planar transmitter.

The present invention relates generally to the field of interface technology with electronic components which may be used for measurement, control and regulation tasks, in particular as isolating amplifiers. These isolating amplifiers provide an electrically conductive disconnection between a primary circuit and a secondary circuit.

BACKGROUND OF THE INVENTION

Transmitters or transformers are used for the electrically conductive disconnection of electrical circuits in accordance with various standards, wherein energy as well as signals and/or data can be transmitted via the transmitters.

Planar transmitters are known in which individual windings of the transmitter are arranged next to one another substantially in one plane. This enables a flat structure, thus allowing the transmitters to be integrated into devices with low installation height for example.

SUMMARY OF THE INVENTION

It would be desirable to even further utilize the given geometrical dimensions of such a transmitter. It is an object of the present invention to propose miniaturization possibilities of planar transmitters.

The object is achieved with a planar transmitter having a vertical extent and a horizontal extent, which has a layer structure with a plurality of electrical circuits, wherein a first electrical circuit and a second electrical circuit are electrically conductively disconnected from one another. Further, it is provided that the transmitter has at least one magnetic core which at least partially surrounds the layer structure and acts at least on the first electrical circuit and on the second electrical circuit, wherein the first electrical circuit and the second electrical circuit lie substantially in one plane and form one layer of the layer structure. It is further provided that at least the first electrical circuit or the second electrical circuit are subdivided into a plurality of electrical circuits which are electrically conductively disconnected from one another.

In this way, more electrically conductively disconnected electrical circuits can be accommodated in a planar transmitter with unchanged spatial requirement without resulting in changes or restrictions to the basic functions and advantages of the transmitter. The additional electrical circuits can be placed above or below already existing electrical circuits and, from a functional point of view, are electrically conductively disconnected from all other electrical circuits.

A partially or fully intrinsically safe transmitter can be provided in this way. A transmitter which is not susceptible to interference and which is suitable for intrinsically safe electrical circuits is referred to as an intrinsically safe transmitter. Intrinsically safe transmitters or transformers are used for the electrically conductive disconnection of circuits in accordance with various standards, wherein energy as well as signals and/or data can be transmitted via the transmitters.

It is true that the arrangement with other electrical circuits in layers one above the other can result in cases in which not all electrical circuits are reliably electrically conductively disconnected from one another in accordance with DIN EN 60079-11. In particular, this can apply to the electrical circuits which are arranged one above the other. However, reliable electrically conductive disconnection of all electrical circuits which are arranged adjacent to one another can be retained.

This procedure results in a mixed transmitter which, in part, can be intrinsically safe, for example with regard to adjacent electrical circuits, and, in part, has electrically conductive functional disconnection, for example with regard to electrical circuits which lie above one another. At the same time, it is not to be ruled out that the electrically conductive disconnection can also satisfy intrinsically safe aspects.

The first electrical circuit or the second electrical circuit can each be subdivided into a plurality or multiplicity of electrical circuits which are electrically conductively disconnected from one another. This means that one electrical circuit forms one unit, wherein this electrical circuit has a plurality of further electrical circuits which are electrically conductively disconnected from one another. Contact can be made with every electrically conductively disconnected electrical circuit from the outside, for example at the transmitter. For example, it can be provided that the first electrical circuits are arranged on a first leg of the transmitter, while second electrical circuits are arranged on a second leg of the transmitter. Here, for example, all first electrical circuits and all second electrical circuits lie substantially in a horizontal plane relative to one another, wherein the first electrical circuits are each arranged above one another in a vertical direction. The second electrical circuits can also each be arranged above one another in a vertical direction.

According to an exemplary embodiment, it can be provided that the transmitter is integrated into a main printed circuit board. In this way, the transmitter does not have to be built as a dedicated component but is produced at the same time as the printed circuit board is manufactured.

According to an exemplary embodiment, it can be provided that the transmitter is designed as a dedicated component. This is particularly advantageous when the transmitter requires more layers than are allocated for a printed circuit board on which the transmitter is to be provided.

According to an exemplary embodiment, it can be provided that the transmitter is formed on an auxiliary printed circuit board. An auxiliary printed circuit board can be made and tested independently of a main printed circuit board, thus enabling manufacturing faults to be excluded at an early stage.

According to an exemplary embodiment, it can be provided that the auxiliary printed circuit board can be arranged on a main printed circuit board. Here, a cost-effective connection between the auxiliary printed circuit board and the main printed circuit board can be produced by means of plug-in contacts for example.

According to an exemplary embodiment, it can be provided that a printed circuit board is designed as a carrier on which tracks and/or turns and/or wires are arranged. This also enables a combination of different manufacturing technologies, such as etching technology and winding technology for example.

According to an exemplary embodiment, it can be provided that at least one electrical circuit has one or more center taps. A center tap can have an intermediate potential which can be used for symmetrical or asymmetrical circuits.

According to an exemplary embodiment, it can be provided that the transmitter has a plurality of cores. A plurality of cores can be combined with one another such that the transmitter can be extended, for example in its horizontal geometry, in a similar way to a construction kit.

According to an exemplary embodiment, it can be provided that individual or a plurality of electrical circuits at least partially surround a plurality of cores. An electrical circuit over a plurality of cores can provide a primary winding which simultaneously couples with a plurality of secondary windings.

According to an exemplary embodiment, it can be provided that a minimum distance between the first electrical circuit and a second electrical circuit provides intrinsically safe electrically conductive disconnection. Here, it can be provided that one or more intrinsically safe electrical circuits can be arranged, for example horizontally, next to one another, and, in turn, can each be subdivided heightwise, i.e. in a vertical extent, into a plurality of electrically conductively disconnected electrical circuits. In this way, a transmitter is provided, in particular a planar transmitter, which is not susceptible to interference and which is suitable for intrinsically safe electrical circuits and can be referred to as a planar intrinsically safe transmitter.

As an extension of a first, second or third electrical circuit, the electrically conductively disconnected electrical circuits can lie on different layers of a printed circuit board, for example one above the other in a vertical direction. In order not to increase or only insignificantly increase the installation height of the transmitter, the layer spacing of the electrical circuits which lie above one can be small, thus resulting in only electrically conductive functional disconnection and possibly not disconnection from intrinsically safe aspects (according to DIN EN 60079-11). It must be noted that the intrinsically safe electrically conductive isolation of the electrical circuits which lie side-by-side is not affected as a result of this procedure.

Minimum distances for the separation of the electrical circuits and therefore also for the turns or windings of the transformers for different safety classes are specified in various regulations and norms, for example DIN EN 60079-11. These minimum distances depend on the insulating medium, so that the minimum distances are subdivided into solid insulation, clearance and creepage distances. In a typical insulation class, for example protection level 375 V, the minimum separating distance for solid insulation, for example, is 1 mm, the creepage distance in air is 10 mm and the creepage distance under a protective layer is about 3.3 mm.

Intrinsically safe transmitters are designed and optimized with regard to the geometry in such a way that the required separating distances for a particular protection level are ensured. This can be provided by wound coils as well as by printed or etched coils on printed circuit boards. Here, in the case of printed or etched coils, it is of advantage that no additional winding processes are required and a good reproducibility can be guaranteed. Further advantages can lie in an improved thermal characteristic for the same core volume. Furthermore, manufacturing costs can be lower.

BRIEF DESCRIPTION OF THE DRAWINGS

Exemplary embodiments of the invention are shown purely schematically in the drawings and are described in more detail below. In the drawings.

All figures are schematic representations which are not to scale. Similar or identical elements in the figures are designated by the same references.

DETAILED DESCRIPTION

Figure 1:
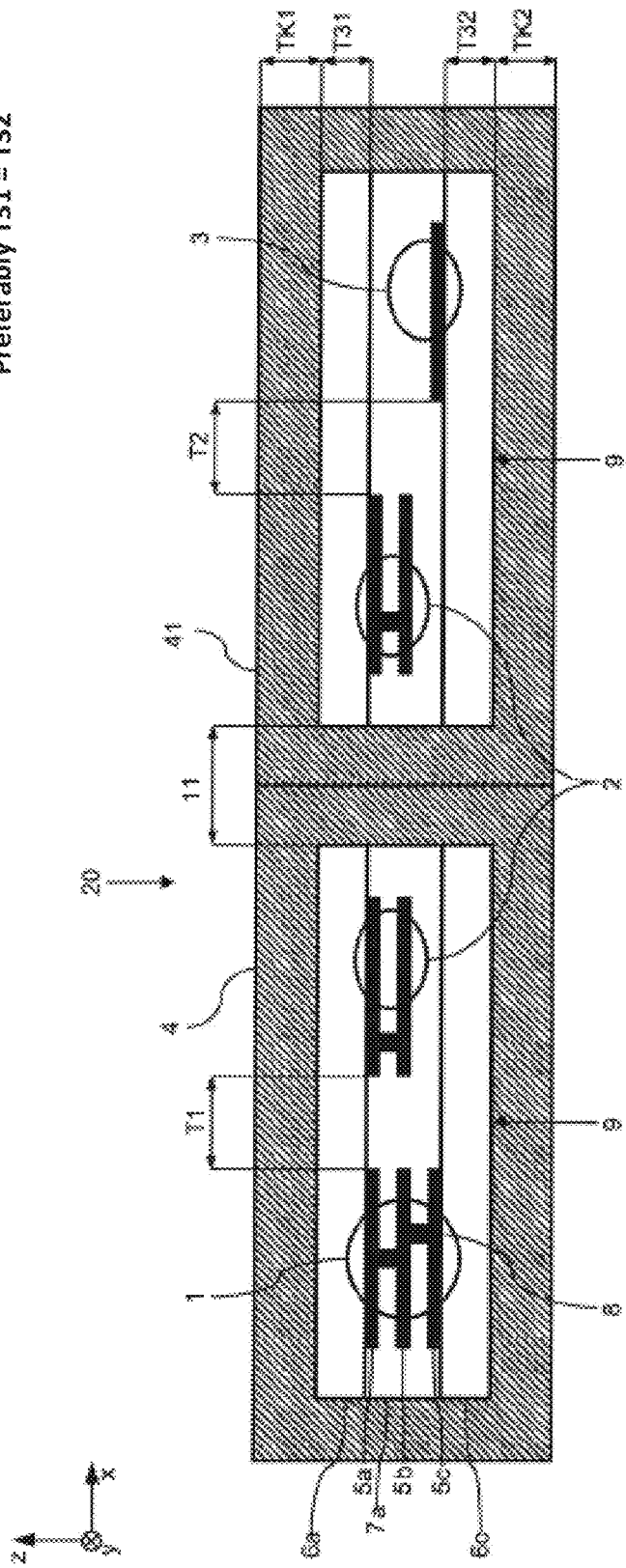
FIG. 1 is a schematic representation of a known transmitter.

FIG. 1 is a schematic representation of a known intrinsically safe transmitter 20 with three windings or a first electrical circuit 1, a second electrical circuit 2 and a third electrical circuit 3, which are electrically conductively disconnected from one another and are arranged horizontally next to one another. The first winding of the first electrical circuit 1 extends over three layers 5a to 5c of a printed circuit board structure 9, the second winding of the second electrical circuit 2 over two layers 5a and 5b, and the third winding of the third electrical circuit 3 over one layer 5c.

The electrical circuits in FIG. 1 are electrically conductively disconnected from one another by the insulations T1 and T2 and likewise from a magnetic core 4, 41 by the insulation 3. In this exemplary embodiment, the magnetic core is formed from two core parts 4 and 41, which are arranged next to one another and penetrate the printed circuit board arrangement 9 in the region 11. Here, the electrical circuit 2 can surround a region 11, for example, and thereby interact with both cores 4 and 41. Although the individual windings or electrical circuits 1, 2, 3 can be arranged on different layers 5a to 5c, they are essentially to be considered as being horizontally next to one another, as the insulation layers (insulation 1, insulation 2) are formed in the horizontal dimension. Only the third insulation (insulation 3), which separates the circuits from the magnetic cores 4, 41, extends through the two minimum parts T31 and T32 in the vertical dimension. The overall insulation thickness is therefore only a minimum of 1×T0, even in the case of three electrical circuits 1, 2, 3 which are to be reliably electrically conductively disconnected, wherein T0 is the minimum insulation thickness in the insulating medium taking into account the protection level.

In FIG. 1, the individual intrinsically safe isolated electrical circuits 1, 2, 3 are located substantially in one plane which is formed by the intermediate layers 5a, 5b, 5c of the printed circuit board 9. The intermediate layers 5a, 5b, 5c are electrically isolated from one another by insulating layers, here identified by 7a, but can also be connected to one another by means of connections 8.

Figure 2:
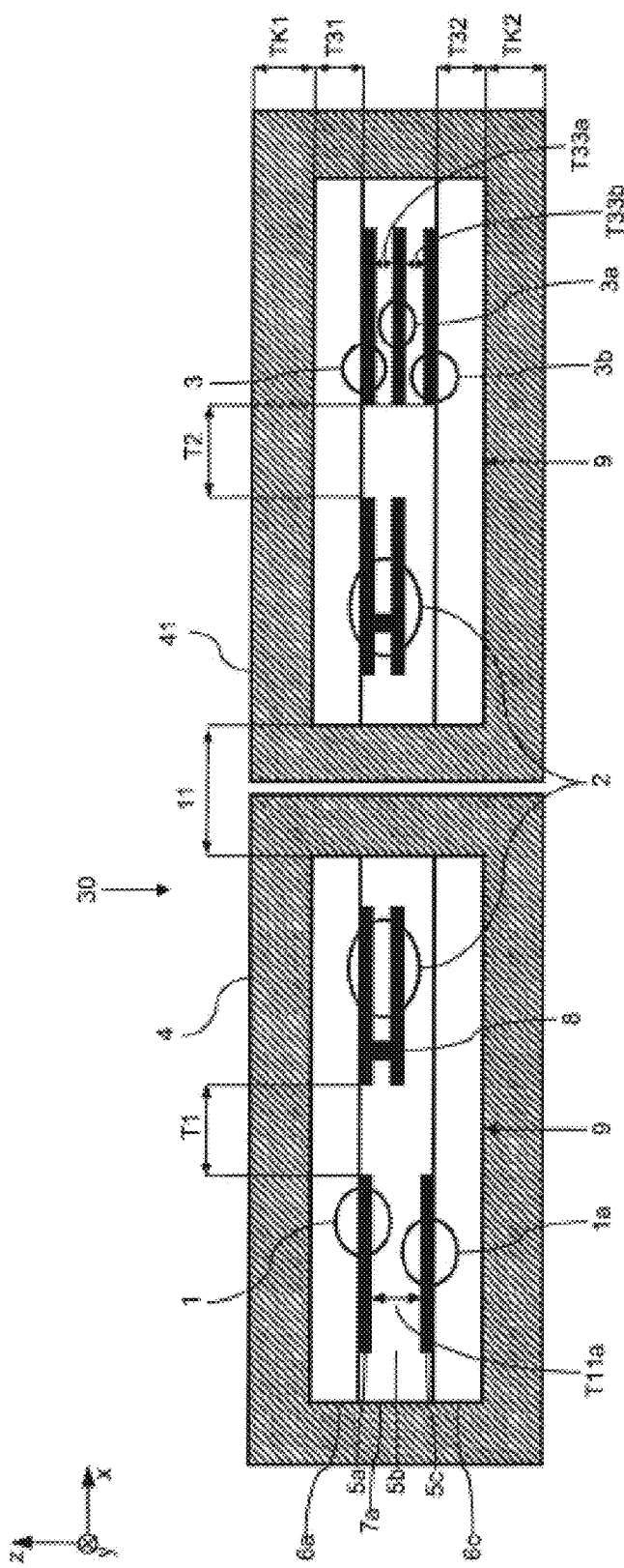
FIG. 2 shows a first exemplary embodiment of a transmitter according to the invention.

FIG. 2 shows an exemplary embodiment of a transmitter 30 according to the invention starting from the exemplary embodiment of FIG. 1. Here, in FIG. 2, in the transmitter 30 according to the invention, the first electrical circuit 1 has been extended by a further first electrical circuit 1a. The second electrical circuit 2 is unchanged compared with FIG. 1. In addition, in FIG. 2, the third electrical circuit 3 has been extended by two further third electrical circuits 3a and 3b.

In FIG. 2, the electrical circuits 1, 2, 3 are insulated with respect to one another in an intrinsically safe manner. The individual intrinsically safe isolated electrical circuits 1, 2, 3 are located substantially in one plane which is formed by the intermediate layers 5a, 5b, 5c of the printed circuit board 9. The intermediate layers 5a, 5b, 5c are electrically isolated from one another by insulating layers, here identified by 7a. However, in contrast to FIG. 1, the intermediate layers 5a, 5b, 5c are in each case designed as separate electrical circuits 1, 1a and 3, 3a, 3b respectively. These electrical circuits 1, 1a, 3, 3a, 3b are connected by means of dedicated connections which are provided externally at the transmitter 30.

The respective electrical circuits 1, 2, 3 are extended in the vertical dimension (z-axis), i.e. the electrical circuits 1, 2, 3 are in each case extended by electrical circuits 1a, 3a, 3b positioned above or below them such that at least one of the electrical circuits 1, 2, 3 is subdivided into a plurality of electrical circuits 1, 1a, 2, 3, 3a, 3b which are electrically conductively disconnected from one another.

This procedure enables further potential groups or electrical circuits which are electrically conductively disconnected to be provided. At the same time however, the overall thickness of the transmitter 30 remains the same and the extent in the horizontal dimension (x-axis) is likewise retained or only changes by a small amount. As can already be seen in FIG. 2, the insulation distances between the individual electrical circuits which are positioned one above the other is relatively small as a result of the measure according to the invention. The separating distance T11a between electrical circuit 1 and electrical circuit 1a is therefore typically less than the separating distance T1 between the electrical circuit 1 and 2 in order to satisfy the strict rules of intrinsic safety. From these aspects, it may therefore be that the electrical circuits 1 and 1a and not adequately insulated from one another to pass an intrinsic safety test. According to other standards or points of reference, the separating distance T11a can, however, be sufficiently large to pass certain withstand voltage tests.

In contrast to the first electrical circuit 1, the third electrical circuit 3 in FIG. 2 has been expanded by two electrical circuits 3a and 3b. These electrical circuits 3, 3a, 3b lie one above the other on the layers 5a, 5b, 5c of the printed circuit board structure and are separated from one another by the insulation distances T33a and T33b respectively. The insulation distances T33a and T33b respectively are also typically smaller compared with the distance T2 so that they may not be sufficient for intrinsically safe isolation. In an exemplary layer structure, T33a and T33b can each be approximately 100 μm, whereas T2, for example, can be 1 mm.

Figure 3:
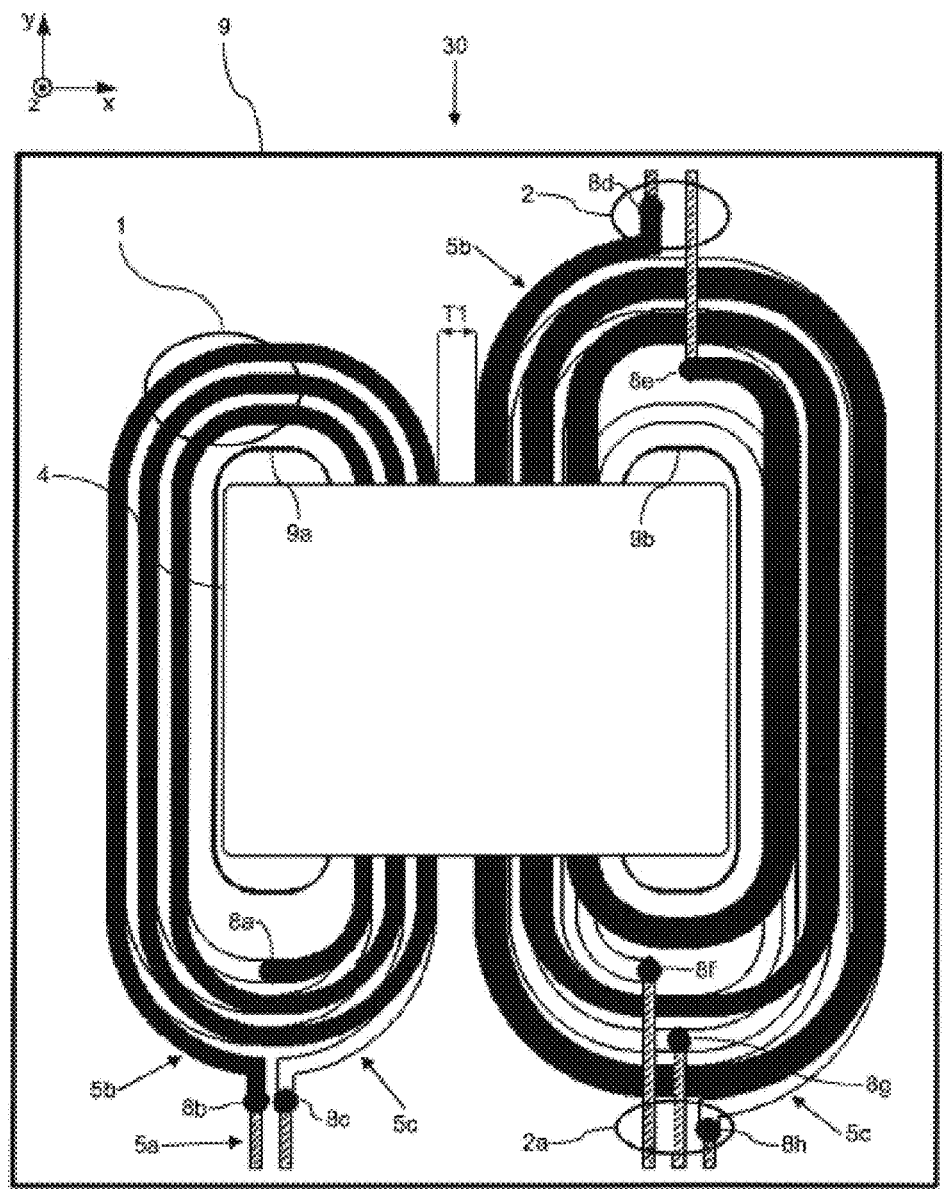
FIG. 3 shows a second exemplary embodiment of a transmitter according to the invention in plan view.
Figure 4:
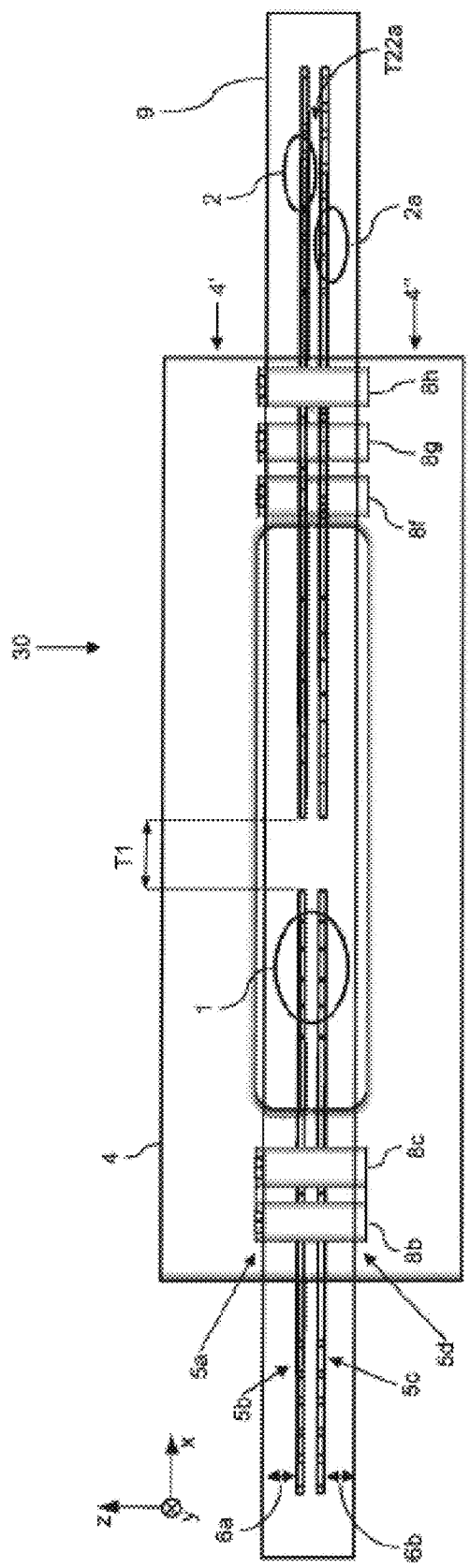
FIG. 4 shows the transmitter according to the invention of FIG. 3 in a side view.

FIG. 3 and FIG. 4 show a further exemplary embodiment of the invention in two different views. FIG. 3 shows a transmitter 30 according to the invention in plan view, and FIG. 4 shows the transmitter 30 according to the invention of FIG. 3 in a side view.

In FIG. 3, the planar transmitter 30 is fitted on a printed circuit board 9 which can constitute the main printed circuit board of an electronic circuit. Further electronic components can therefore be fitted as well as the transmitter 30. Alternatively, the transmitter 30 can be fitted on a separate printed circuit board which substantially has only the transmitter 30. In this case, connecting contacts of the transmitter 30 can be brought to the edge of the printed circuit board 9 in order to be able to connect from there to further electronics on the main printed circuit board. The printed circuit board 9 has a four-layer structure with the layers 5a to 5d with two cutouts 9a and 9b, through which the magnetic core 4 can be fed.

In FIG. 3, the individual intrinsically safe isolated electrical circuits 1 and 2, 2a are located substantially in one plane which is formed by the intermediate layers 5b, 5c of the printed circuit board 9. The intermediate layers 5b, 5c are electrically isolated from one another by insulating layers, for example with the distance T22a (cf. FIG. 4). The first electrical circuit 1 in FIG. 3 and FIG. 4 is as realized in FIG. 1, i.e. in two layers 5b, 5c with a through-connection 8a which is shown in FIG. 3. On the other hand, the second electrical circuits 2, 2a are electrically conductively disconnected from one another and are connected by means of dedicated through-connections 8d, 8e for electrical circuit 2 and 8h, 8g, 8f for electrical circuit 2a, which are fed out on layer 5a at the transmitter 30. Here, through-connections are electrical connections from one layer to another layer, which are provided, for example, by holes on the printed circuit boards and, for example, are clad with electrically conductive material on the inside.

In this exemplary embodiment, the first electrical circuit 1 in FIG. 3 is the primary winding of the transmitter 30 or transformer, which is designed in the form of a spiral on two different inner layers 5b (filled in black) and 5c (filled in white) with a total of six turns. The two layers 5b, 5c are electrically connected to one another by means of through-connection 8a, and the whole winding is fed to the outer layer 5a (shown dashed) by means of optional through-connections 8b and 8c. The turns of the first electrical circuit 1 are separated from the cutout 9a of the printed circuit board 9 with a minimum insulation of T0/2 and also do not come closer to the top and bottom face of the printed circuit board 9 than T0/2. This is ensured by the layer structure, as the insulation layers 6a and 6b have a minimum thickness of T0/2.

The first electrical circuit 1 is reliably electrically conductively disconnected from the further second electrical circuits 2 and 2a by an isolating section T1>=T0. These two second electrical circuits 2, 2a can, for example constitute two secondary windings of a transmitter 30. The spiral-shaped turns of the two electrical circuits 2 and 2a are in turn realized on the inner layers of the printed circuit board 9 and likewise do not come closer to the cutout 9b than T0/2, thus enabling a reliable electrically conductive disconnection to be achieved between the first electrical circuit 1 and the second electrical circuits 2, 2a.

According to the invention, the two second electrical circuits 2 and 2a in FIG. 3 are arranged above one another on two different inner layers of the printed circuit board 9 and do not touch one another at any geometrical point on the printed circuit board. The turns of the electrical circuit 2 are therefore realized on layer 5b of the printed circuit board and are connected to the connecting wires of layer 5a by means of the connections 8d and 8e respectively. On the other hand, the spiral-shaped turns of the electrical circuit 2a are realized on the inner layer 5c and are connected to the connection layer 5a by means of connections 8f, 8g and 8h. In this case, the winding 2a is formed with three connections, wherein the middle connection in FIG. 3 can form a center tap.

The turns of the two second electrical circuits 2 and 2a in FIG. 3 are sized such that no short circuits occur between the two electrical circuits 2 and 2a. This must particularly be taken into account with the through-connections. For example, the three turns of the electrical circuit 2 pass around the through-connections 8f and 8g in such a way that there can be no short circuits and that a minimum insulation is maintained.

As a result of the measure described, the two electrical circuits or windings 2 and 2a are also electrically conductively disconnected from one another. Other standards can be called upon when sizing the separating distances of these two electrical circuits 2, 2a. For example, the insulation distances between the electrical circuits 2 and 2a can be designed such that they withstand a test voltage of 3 kV DC for example.

FIG. 4 shows the exemplary embodiment of FIG. 3 from a side perspective. The turns of the first electrical circuit 1 are arranged on the layers 5b and 5c of the printed circuit board 9 and are connected to the upper layer 5a and to the connections of the winding of the first electrical circuit 1 by means of connections 8b and 8c. The individual turns pass in the form of a spiral around the left-hand leg of the magnetic core 4 which, in this exemplary embodiment of FIG. 4, is formed from two identical U-sections 4' and 4" which can be glued or clamped to one another. The individual core sections 4', 4" can also be varied; for example a U-core half can be formed with an I-core half, i.e. a straight-line geometry, to produce a similar core geometry 4.

The second electrical circuits 2 and 2a are electrically conductively disconnected from one another by means of an insulation layer with the thickness T22a and pass around the right-hand leg of the core 4. The windings of the second electrical circuits 2 and 2a are connected to the outer layer 5a and its connections in a corresponding way to FIG. 3 by means of the through-connections 8d (shown in FIGS. 3) and 8e (shown in FIG. 3) as well as by means of the through-contacts 8f, 8g, 8h. In this exemplary embodiment, the bottom external conductive layer 5d remains unused.

The invention is not restricted to the present exemplary embodiments, thus enabling characteristics of one exemplary embodiment to be combined with characteristics of another exemplary embodiment.

LIST OF REFERENCES 1, 2, 3 Electrical circuit or potential group
1a, 2a, 3a, 3b Extended electrical circuit
4 Magnetic core
4' First part of a magnetic core
4" Second part of a magnetic core
41 Magnetic core
5a to 5g Printed circuit tracks
6a to 6c Insulation layer between the electrical circuits
7a to 7b Insulation layer within an electrical circuit
8, 8a to 8h Electrical through-connection
9 Printed circuit board
9a, 9b Cutouts
11 Region of a cutout in a printed circuit board
20 Transmitter
30 Transmitter according to the invention
T0 Minimum insulation Protection level Insulation thickness
TK1 First thickness of a magnetic core
TK2 Second thickness of a magnetic core
T1 First insulation thickness
T2 Second insulation thickness
T21 Distance Insulation thickness
T22 Distance Insulation thickness
T31 Distance Insulation thickness
T32 Distance Insulation thickness
T11a, T22a, T33a, T33b Insulation distance

The invention claimed is:

1. A planar transmitter having a vertical extent and a horizontal extent having:
a layer structure comprising a plurality of electrical circuits, the plurality of electrical circuits including a first electrical circuit and a second electrical circuit, the first electrical circuit and the second electrical circuit electrically conductively disconnected from one another,
at least one magnetic core, which at least partially surrounds the layer structure and acts at least on the first electrical circuit and on the second electrical circuit,
wherein the first electrical circuit and the second electrical circuit lie substantially in one horizontal plane and form one layer of the layer structure,
wherein the first electrical circuit comprises a primary winding of the transmitter and the second electrical circuit comprises a secondary winding of the transmitter,
wherein one of the first and second electrical circuits is extended with at least one other electrical circuit of the plurality of electrical circuits,
wherein the one of the first and second electrical circuits is electrically disconnected from the at least one other electrical circuit, and
wherein the one of the first and second electrical circuits and the at least one other electrical circuit are vertically arranged.

2. The transmitter as claimed in claim 1, wherein the transmitter is integrated into a main printed circuit board.

3. The transmitter as claimed in claim 1, wherein the transmitter is designed as a dedicated component.

4. The transmitter as claimed in claim 3, wherein the transmitter is formed on an auxiliary printed circuit board.

5. The transmitter as claimed in claim 4, wherein the auxiliary printed circuit board can be arranged on a main printed circuit board.

6. The transmitter as claimed in claim 1, wherein a printed circuit board is designed as a carrier on which tracks and/or turns and/or wires are arranged.

7. The transmitter as claimed in claim 1, wherein at least one of the plurality of electrical circuits has one or more center taps.

8. The transmitter as claimed claim 1, wherein the at least one magnetic core is a plurality of magnetic cores.

9. The transmitter as claimed in claim 8, wherein individual or a plurality of the plurality of electrical circuits at least partially surround the plurality of magnetic cores.

10. The transmitter as claimed in claim 1, wherein a minimum distance between the first electrical circuit and the second electrical circuit provides intrinsically safe electrically conductive disconnection.

11. The transmitter as claimed in claim 1, wherein the other one of the first and second electrical circuits is extended with at least one further electrical circuit of the plurality of electrical circuits, wherein the other one of the first and second electrical circuits is electrically disconnected from the at least one further electrical circuit, and wherein the other one of the first and second electrical circuits and the at least one further electrical circuit are vertically arranged.

* * * * *